(12) United States Patent
Yim

(10) Patent No.: US 8,383,460 B1
(45) Date of Patent: Feb. 26, 2013

(54) METHOD FOR FABRICATING THROUGH SUBSTRATE VIAS IN SEMICONDUCTOR SUBSTRATE

(75) Inventor: Myung Jin Yim, Rexford, NY (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/243,502

(22) Filed: Sep. 23, 2011

(51) Int. Cl.
*H01L 21/00* (2006.01)
(52) U.S. Cl. ............ 438/118; 438/459; 438/464
(58) Field of Classification Search ............ None
See application file for complete search history.

(56) References Cited

U.S. PATENT DOCUMENTS

| | | | |
|---|---|---|---|
| 7,105,424 B2 * | 9/2006 | Tsai et al. | 438/464 |
| 7,507,637 B2 * | 3/2009 | Suh et al. | 438/458 |
| 2003/0113984 A1 * | 6/2003 | Okada et al. | 438/459 |
| 2005/0026394 A1 * | 2/2005 | Letertre et al. | 438/459 |
| 2006/0006520 A1 * | 1/2006 | Wood et al. | 257/698 |
| 2006/0138629 A1 * | 6/2006 | Fukazawa | 257/686 |
| 2007/0072393 A1 * | 3/2007 | Aspar et al. | 438/459 |
| 2011/0117826 A1 * | 5/2011 | Sjolander et al. | 451/365 |
| 2011/0237004 A1 * | 9/2011 | Lee et al. | 438/15 |

FOREIGN PATENT DOCUMENTS

JP 2006104309 A * 4/2006

OTHER PUBLICATIONS

"TSV Thinned Wafer Debonding Process Optimization," Mark Privett et al., pp. 144-148.

* cited by examiner

*Primary Examiner* — Alonzo Chambliss
(74) *Attorney, Agent, or Firm* — Ingrassia Fisher & Lorenz, P.C.

(57) ABSTRACT

Methods are provided for fabricating integrated circuit systems that include forming integrated circuits in and on a semiconductor substrate. Via holes are etched into a front surface of the semiconductor substrate and are filled with a conductive material. A carrier wafer having a layer of adhesive thereon is provided and an imprinted pattern is formed in the layer of adhesive. The front surface of the semiconductor substrate is bonded to the carrier wafer with the patterned layer of adhesive. A portion of a back surface of the semiconductor substrate is removed to expose a portion of the conductive material and the thinned back surface is attached to a second substrate. The semiconductor substrate is then debonded from the carrier wafer.

20 Claims, 5 Drawing Sheets

US 8,383,460 B1

METHOD FOR FABRICATING THROUGH SUBSTRATE VIAS IN SEMICONDUCTOR SUBSTRATE

TECHNICAL FIELD

The present invention generally relates to methods for fabricating integrated circuit systems, and more particularly relates to methods for fabricating integrated circuit systems including thinned substrates attached to other circuits or substrates.

BACKGROUND

Integrated circuit systems often include integrated circuits (ICs) that are attached to other ICs, interposer boards, or printed circuit boards in a stacked relationship. The IC system can include, for example, microprocessor circuits, memory circuits, analog circuits, and the like that are interconnected to take advantage of the unique attributes of the individual circuits. By vertically stacking the system components the size or footprint of the system can be minimized. Interconnection between the system components can be realized, in part, by through substrate vias (TSVs). Providing TSVs requires thinning the semiconductor substrate in and on which the IC is fabricated. Thinning a large semiconductor wafer (typically 300 millimeters in diameter) to a thickness of 30-100 microns ($\mu$m) is a challenging process that can seriously impact the yield of the integrated circuit system.

Accordingly, it is desirable to provide high yielding methods for fabricating integrated circuit systems. In addition, it is desirable to provide methods for fabricating integrated circuit systems that avoid the yield impacting difficulties of thinning the integrated circuit semiconductor substrates. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating integrated circuit systems. In accordance with one method integrated circuits are formed in and on a semiconductor substrate. Via holes are etched into a front surface of the semiconductor substrate and are filled with a conductive material. A carrier wafer having a layer of adhesive thereon is provided and an imprinted pattern is formed in the layer of adhesive. The front surface of the semiconductor substrate is bonded to the carrier wafer with the patterned layer of adhesive. A portion of a back surface of the semiconductor substrate is removed to expose a portion of the conductive material and the thinned back surface is attached to a second substrate. The semiconductor substrate is then debonded from the carrier wafer.

In accordance with another embodiment, integrated circuit systems are formed by first forming integrated circuits in and on a semiconductor substrate and etching via holes into a front surface of the semiconductor substrate. The via holes are filled with a conductive material as a first step in forming through substrate vias. A plurality of solder bumps, arranged in a bump pattern and each having substantially the same height, are formed overlying the front surface and contacting the conductive material. A carrier wafer having a layer of adhesive thereon is provided, and an imprinted pattern is formed in the layer of adhesive. The imprinted pattern includes upstanding portions and depressed portions of the adhesive and the depressed portions are located to substantially correspond to the bump pattern. The front surface of the semiconductor substrate is bonded to the carrier wafer with the patterned layer of adhesive in such a manner that the depressed portions are positioned to avoid substantial contact between the layer of adhesive and the solder bumps. A portion of a back surface of the semiconductor substrate is removed to expose a portion of the conductive material. Thereafter the back surface is attached to a second substrate and the semiconductor substrate is de-bonded from the carrier wafer.

In accordance with yet another embodiment, a method for fabricating an integrated circuit system includes forming integrated circuits in and on a front surface of a semiconductor substrate. A carrier wafer having a patterned layer of adhesive thereon is provided and the front surface of the semiconductor substrate is bonded to the carrier with the patterned layer of adhesive. The back surface of the semiconductor substrate is polished to thin the semiconductor substrate and a back surface metallization pattern is formed on the thinned semiconductor substrate. The back surface is adhered to a second substrate and the semiconductor substrate is de-bonded from the carrier wafer.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Fabricating integrated circuit (IC) systems often involves thinning of a semiconductor substrate in and on which a plurality of ICs have been formed. The thinning process may be part of the process of forming through substrate vias (TSVs) that facilitate interconnecting chips and substrates in stacked, three dimensional configurations. Thinning the semiconductor substrate requires bonding the substrate to a carrier wafer that provides physical support during the thinning as well as during processing of the back side of the substrate. Unfortunately the conventional bonding and subsequent de-bonding are major sources of yield loss in the IC system fabrication, especially since the de-bonding must be carried out on a very thin and fragile substrate. The de-bonding process can damage the surface topography of the ICs including any solder bumps attached to the ICs. Removal of the adhesive used in the bonding is difficult and can lead to damage to the solder bumps or other surface features.

FIGS. 1-14 illustrate schematically, in simplified cross sectional views, method steps in accordance with various embodiments for fabricating integrated circuit systems. The described embodiments serve to ameliorate or overcome the above-mentioned yield reducing problems. As used herein, "integrated circuit system" means a system having at least one integrated circuit (IC) chip or die that is bonded to another substrate which may be a another chip, interposer layer, or printed circuit board. Although not illustrated, the IC system can include a plurality of IC chips, perhaps of different types such as microprocessor, memory, analog, or the like, that are stacked together to form a three dimensional system. Various steps in the manufacture of ICs and IC systems are well known to those of skill in the art and so, in the interest of brevity, in describing the embodiments many conventional steps will only be mentioned briefly herein or will be omitted entirely without providing the well known process details. Two cases will be considered and described, both cases illustrating the fabrication of ICs for application in IC systems. FIGS. 1-7 relate to the first case and FIGS. 8-14 relate to the second case. In the first case the illustrative IC is fabricated with copper or other metallic electrodes on both the front and back surfaces of the semiconductor substrate. In the second case, the illustrative IC is fabricated with microbumps or solder bumps on one or both surfaces of the semiconductor substrate.

Figure 1:
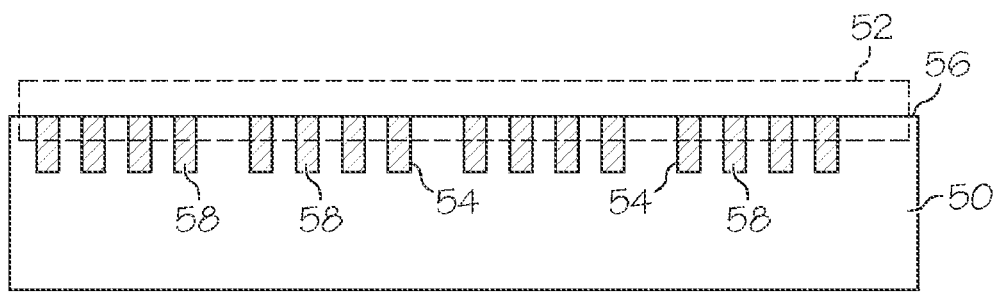
FIGS. 1-14 illustrate schematically, in simplified cross-sectional views, methods for fabricating integrated circuit systems in accordance with various embodiments.

As illustrated in FIG. 1, the method for fabricating an IC system of the first case type begins by fabricating a plurality of ICs in and on a semiconductor substrate 50. In this simplified cross sectional view the plurality of integrated circuits are simply indicated by the single dashed area 52. As is well known, ICs are generally rectangular in form and are positioned on the semiconductor substrate in a regular array, each IC separated from the next by a scribe grid. As part of the method for fabricating stacked arrays of IC chips, a plurality of spaced apart via openings 54 are etched into the front surface 56 of the semiconductor substrate. The via openings can have a depth of, for example, 30-100 micrometers (µm). The via openings are filled with a conductive material 58 such as copper. The via openings, filled with a metal or other conductive material, will form through substrate vias (TSVs) that provide efficient means for interconnecting a plurality of chips and associated substrates. The filled vias can be formed at various times in the fabrication of the IC, but are most conveniently formed after the first layer of metallization is deposited and patterned. Although not illustrated in this cross sectional view, the fabrication process continues by providing interconnect metallization that electrically interconnects the conductive material and various transistors and other devices on the semiconductor substrate to implement the designed integrated circuit function. The process of interconnecting all of the devices may require several layers of metallization, with the layers of metallization separated by interlayer dielectrics (ILDs). Preferably the interconnect metallization is formed of copper. Processing of the front surface of semiconductor substrate 50 is completed by depositing a protective layer of passivating dielectric material and subsequently etching openings through that layer to allow access to bonding pads. The transistors, other devices, interconnect metallization layers, ILDs, and passivating dielectric material are all represented by the aforementioned dashed area 52.

Figure 2:
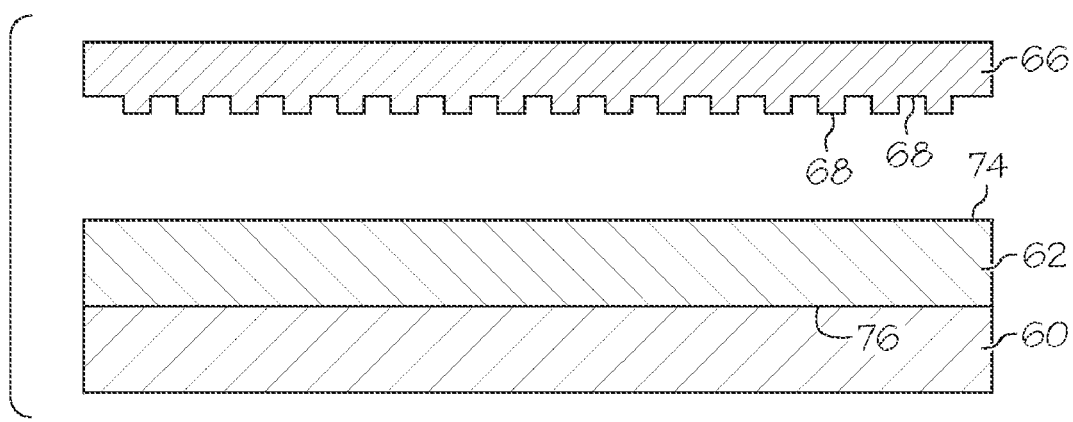

The method in accordance with one embodiment continues as illustrated in FIG. 2 by providing a carrier wafer 60 having an adhesive layer 62 thereon. The carrier wafer can be, for example, a silicon substrate or a glass substrate. The adhesive layer material is selected based on the conditions semiconductor substrate 50 must go through during processing of the back side of the substrate. These conditions may include chemical exposure, chemical mechanical polishing (CMP), elevated temperatures, vacuum environments, and the like. The adhesive layer material selected must be resistant to the conditions that will be encountered, but is generally a spin-on polymer coating such as a thermoplastic material or a silicone based or organo-polysiloxane based solution. Such materials are available, for example from Shin-Etsu MicroSi Inc. having an office at 10028 S. 51$^{st}$ Street, Phoenix, Ariz. 85044, Brewer Science Inc. having an office at 2401 Brewer Drive, Rolla, Mo. 65401, or Sumitomo Bakelite North America, Inc. having an office at 46820 Magellan Drive, Novi, Mich. 48377. The thickness of adhesive layer 62 is preferably at least three times the height of the highest topological feature on the front surface of the semiconductor substrate and typically is much thicker than that, in the range of 20-100 µm. The thickness of the layer can be controlled by controlling the spin conditions and also the number of layers applied to carrier wafer 60. After application by a spin-on process the adhesive layer is thermally baked to drive off volatile solvents. As also illustrated in FIG. 2, a stamping form 66 is also provided. The stamping form, preferably formed of metal, hardened plastic, ceramic, or other rigid material is designed with a crenellated pattern 68 of raised and depressed regions in its surface.

Figure 3:
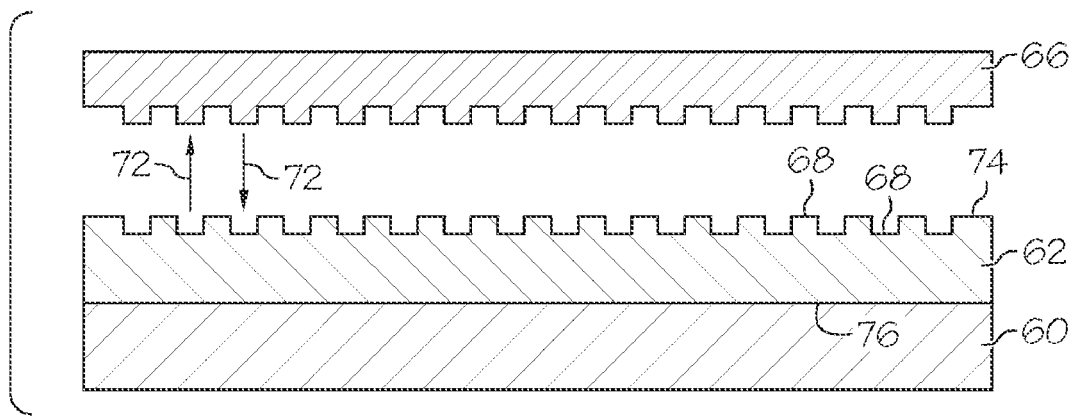

As illustrated in FIG. 3, the method continues by stamping adhesive layer 62 with stamping form 66 to form a crenellated patterned in the surface of the adhesive layer. The stamping form is pressed into the adhesive layer and then is withdrawn, as indicated by arrows 72, to imprint crenellated pattern 68 of raised and depressed regions into surface 74 of the adhesive layer. In accordance with one embodiment, crenellated pattern can be, for example, a mesh or waffle pattern. Further in accordance with this embodiment, the mesh pattern preferably has a density of less than about 50%. That is, in the layer of adhesive the raised regions of the crenellated pattern are less than about 50% of the total area of the adhesive layer. The crenellated pattern extends only partially through the thickness of the adhesive layer. The height of the raised regions, in contrast to the depressed regions, is preferably greater than the height of the highest topological feature on the front surface of the semiconductor substrate. The unpatterned rear surface 76 of the adhesive layer remains in contact with the carrier wafer across the entire breadth of the carrier wafer.

Figure 4:
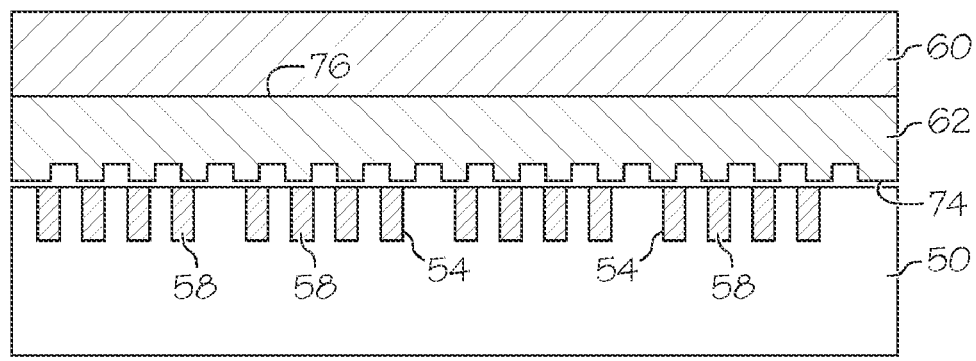

The patterned layer of adhesive is used to bond the front surface of semiconductor substrate 50 to the carrier wafer as illustrated in FIG. 4. Patterned surface 74 of the layer of adhesive is brought into contact with the front surface of semiconductor substrate 50 and the carrier wafer, adhesive, and semiconductor substrate are subjected to temperature and pressure to effect the secure bonding of the semiconductor substrate to the carrier wafer. The time, temperature, and pressure utilized in the bonding operation depend on the particular material used in the layer of adhesive. As noted above, the unpatterned rear surface of the adhesive layer is in contact with the carrier wafer to provide maximum adhesion of the adhesive to the carrier wafer. Because of the crenellated pattern imprinted into patterned surface 74, only a portion of the surface of the semiconductor substrate is in intimate contact with the layer of adhesive. As will be explained below, the limited contact between the semiconductor substrate and the adhesive is advantageous when the semiconductor and carrier wafer are subsequently de-bonded.

Figure 5:
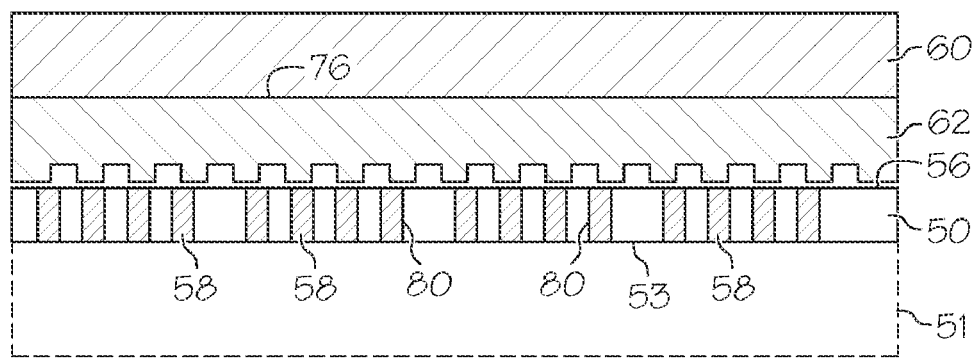

As illustrated in FIG. 5, the method for fabricating an integrated circuit system continues, in accordance with one embodiment, by processing the back surface of semiconductor substrate 50. For example, the back surface of the semiconductor substrate can be subjected to a thinning operation to thin the substrate sufficiently to expose a portion of conductive material 58. The original back surface is indicated by dashed lines 51 and the thinned back surface by solid line 53. The conductive material now extends through the substrate from front surface 56 to back surface 53 forming through substrate vias (TSVs) 80. The semiconductor substrate can be thinned, for example, by chemical mechanical polishing (CMP). Other process steps can be applied to the now thinned back surface of the semiconductor substrate such as forming a patterned, metallized redistribution layer (RDL) in electrical communication with the TSVs and an overlying passivation layer, neither of which is shown in this cross-sectional view. In some applications, solder bumps may also be attached to the RDL layer.

Figure 6:
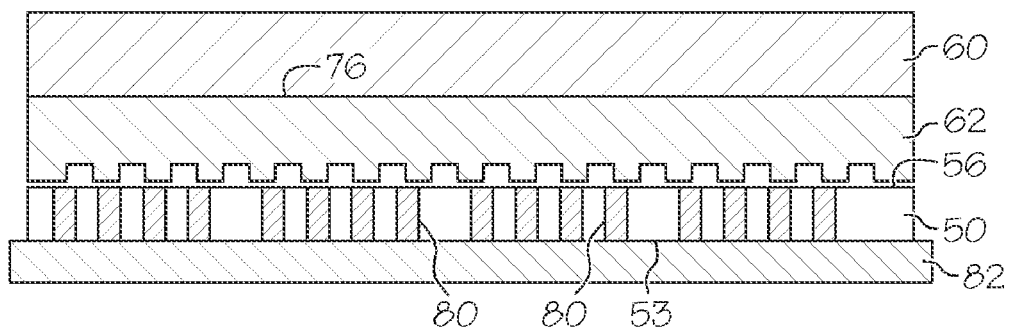

Following the thinning and processing of the back surface of semiconductor substrate 50, back surface 53 is attached to a substrate 82 as illustrated in FIG. 6. Substrate 82 can be, for example, a layer of dicing tape, an interposer layer, a printed circuit board, or another IC semiconductor substrate. If substrate 82 is a layer of dicing tape, semiconductor substrate 50 and the dicing tape are laminated together in preparation for dicing the semiconductor substrate to separate individual integrated circuits fabricated therein and thereon. If substrate 82 is an interposer layer, a printed circuit board, or another IC, the semiconductor substrate is bonded to substrate 82 and metal-to-metal contact is made between metallized contacts on the patterned RDL layer and electrical contacts of a patterned metallization layer on substrate 82. The metal-to metal contacts allow electrical signals to be conveyed between the substrate and the ICs formed in and on semiconductor substrate 50. Again, the patterned RDL layer and the patterned metallization layer on substrate 82 are not shown in this cross-sectional view.

Figure 7:
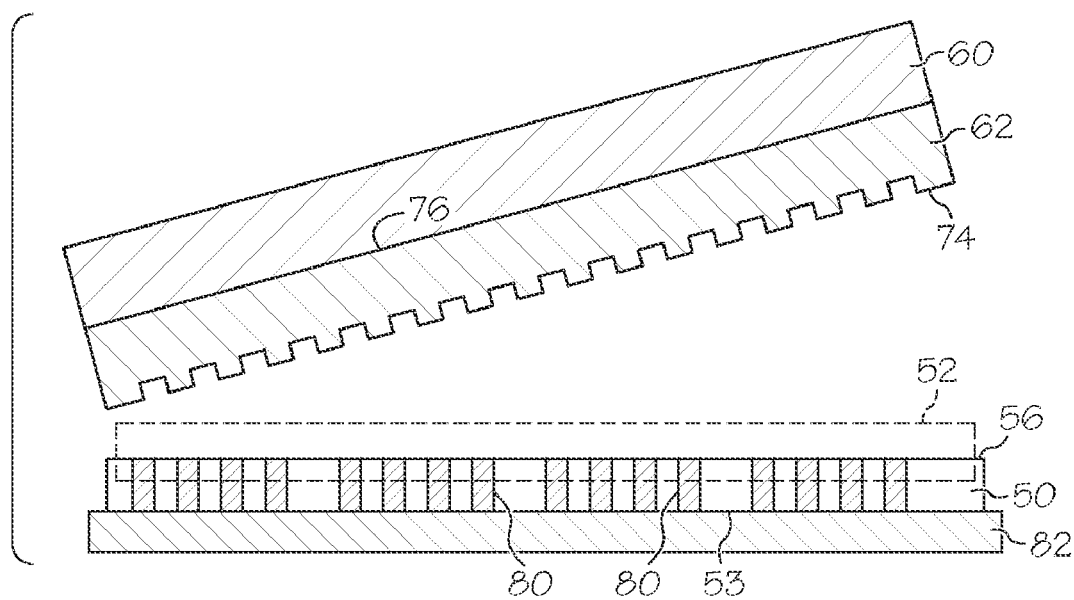

As illustrated in FIG. 7, once semiconductor substrate 50 is attached to substrate 82 and the thinned semiconductor substrate is supported by substrate 82, carrier wafer 60 and patterned adhesive layer 62 can be de-bonded from the semiconductor substrate. There are at least three ways to accomplish the de-bonding, depending, in part, on the material selected for adhesive layer 62. Carrier wafer 60 can be removed by a chemical process, an ultraviolet (UV) process, or a thermal process. The adhesive layer can be softened by a chemical solvent, UV radiation, or heat, respectively. Because of the imprinted pattern stamped into the surface of the layer of adhesive, a reduced amount of the adhesive is in contact with the front surface of semiconductor substrate 50 in contrast to the complete coverage of the carrier wafer by the adhesive. This means that the adhesive is more strongly bonded to the carrier wafer and correspondingly less strongly bonded to the semiconductor substrate. The reduced amount of adhesive in contact with the front surface of the semiconductor substrate causes most of the adhesive to remain attached to carrier wafer 60 and only a lesser amount to remain attached to the front surface of the semiconductor substrate during de-bonding. The reduced amount of adhesive in contact with the front surface of semiconductor substrate 50 reduces the possibility of damaging any of the features on the surface of ICs 52 as the carrier wafer and the semiconductor substrate are separated. Because a lesser amount of adhesive remains attached to the front surface of semiconductor substrate 50, there also is less adhesive to remove in subsequent surface cleaning operations and thus, again, less chance to damage features on the surface of ICs 52.

Figure 8:
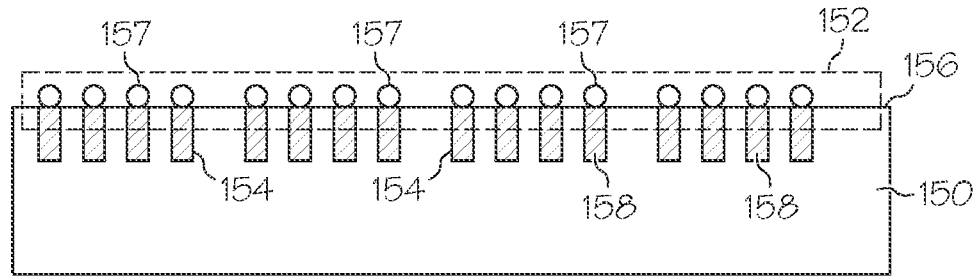

As illustrated in FIG. 8, the method for fabricating an IC system of the second case type begins in the same way as for the first case by fabricating a plurality of ICs in and on a semiconductor substrate 150. Again, in this simplified cross-sectional view the plurality of integrated circuits are simply indicated by the single dashed area 152. As with the first case, a plurality of via openings 154 are etched into front surface 156 of the semiconductor substrate and are filled with a conductive material 158 such as copper to subsequently form through substrate vias. Although not illustrated in this cross-sectional view, the fabrication process continues by providing layers of interconnect metallization that electrically interconnects the conductive material and various devices on the ICs to implement the intended circuit function. A layer of passivating dielectric material is deposited and patterned after all of the interconnect metallization is completed. The interconnect metallization and passivating dielectric are not illustrated in these cross-sectional views. Openings are etched through the layer of passivating dielectric material to expose selected portions of the interconnect metallization and a plurality of spaced apart solder bumps 157 or microbumps are formed in a bump pattern in the openings in electrical contact with the interconnect metallization and the conductive material and thus coupled to the integrated circuits. Although solder bumps and microbumps are not identical, for conciseness and ease of discussion, the term "solder bumps" will be used herein, without limitation, to refer to either. Preferably the solder bumps are all of substantially the same height. The transistors, other devices, interconnect metallization layers, and passivating dielectric material are all represented by the aforementioned dashed area 152.

Figure 9:
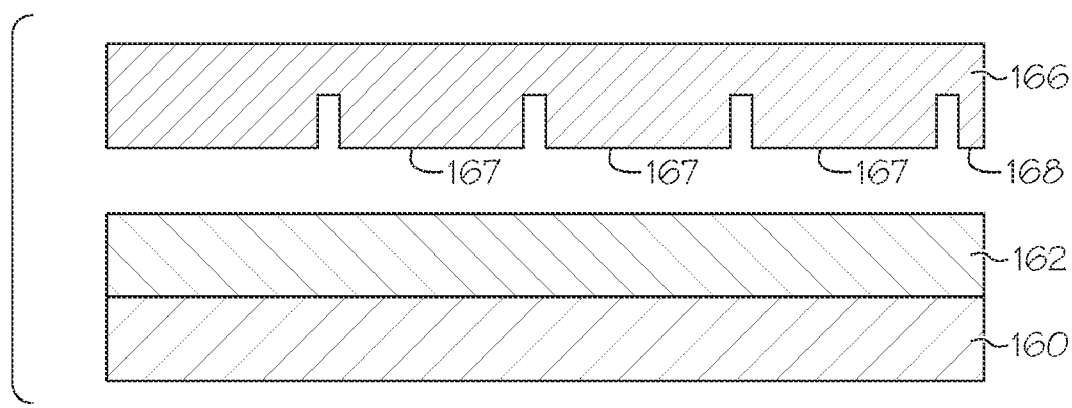

In the same manner as illustrated in FIG. 2, the method in accordance with this embodiment continues as illustrated in FIG. 9 by providing a carrier wafer 160 having an adhesive layer 162 thereon. A stamping form 166 is also provided. The same criteria used to select carrier wafer 60, adhesive layer 62 and stamping form 66 also apply to selecting carrier wafer 160, adhesive layer 162 and stamping form 166. Adhesive layer 162 is applied, for example by a spin-on process, to the desired thickness and then is heated to drive off volatile solvents. Stamping form 166 is designed with a crenellated pattern 168 of raised and depressed regions in its surface. The crenellated pattern on the stamping form, in accordance with this embodiment, includes raised portions 167 that correspond to the bump pattern of solder bumps 157. The crenellated pattern can otherwise be a regular pattern such as a mesh pattern in areas other than those areas corresponding to the locations of the solder bumps.

Figure 10:
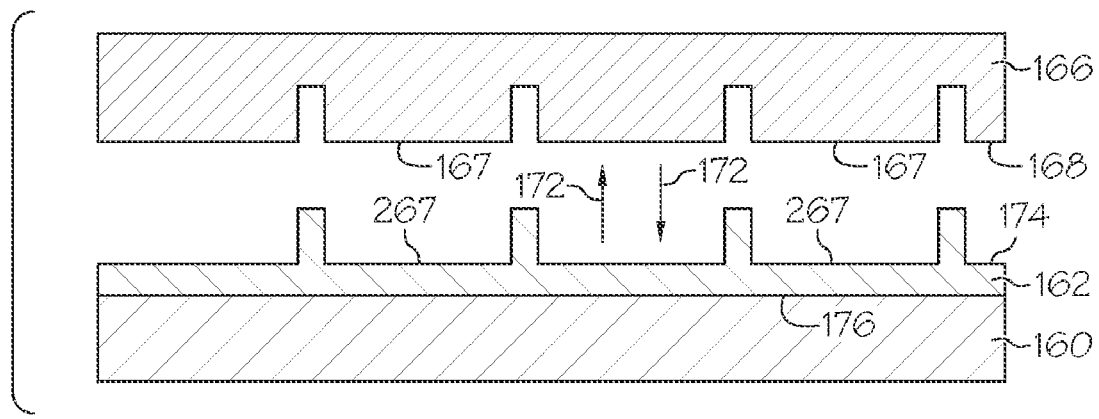

As illustrated in FIG. 10, the method in accordance with this embodiment continues by stamping adhesive layer 162 with stamping form 166 to form a patterned imprint in the layer of adhesive. The stamping form is pressed into the adhesive layer and then is withdrawn as indicated by arrows 172 to imprint crenellated pattern 168 of raised and depressed regions into surface 174 of the adhesive layer. The stamping form is aligned with the carrier wafer and the layer of adhesive in such a manner that raised portions 167 of the stamping form result in depressed regions 267 in the adhesive layer that correspond to the bump pattern of solder bumps on the surface of the semiconductor substrate. Preferably the crenellated pattern has a density of less than about 50%. That is, preferably on the adhesive layer the raised portions of the crenellated pattern are less than 50% of the total area of the adhesive layer. Except in the area of the bump pattern of solder bumps, crenellated pattern 168 can be similar to crenellated pattern 68 although they appear very dissimilar in a comparison of FIGS. 3 and 10. The seeming dissimilarity is an artifact of choosing the cross-section of FIG. 10 to lie along a line corresponding to the intended line of solder bumps. The remainder of adhesive layer 162 can be imprinted with a pattern similar to that on adhesive layer 62 on carrier wafer 60. As with the previous embodiments the crenellated pattern extends only partially through the thickness of the adhesive layer. The height of the raised regions, in contrast to the depressed regions, is preferably greater than the height of solder bumps 157. The unpatterned rear surface 176 of the adhesive layer is in contact with carrier wafer 160 across substantially the entire breadth of the carrier wafer.

Figure 11:
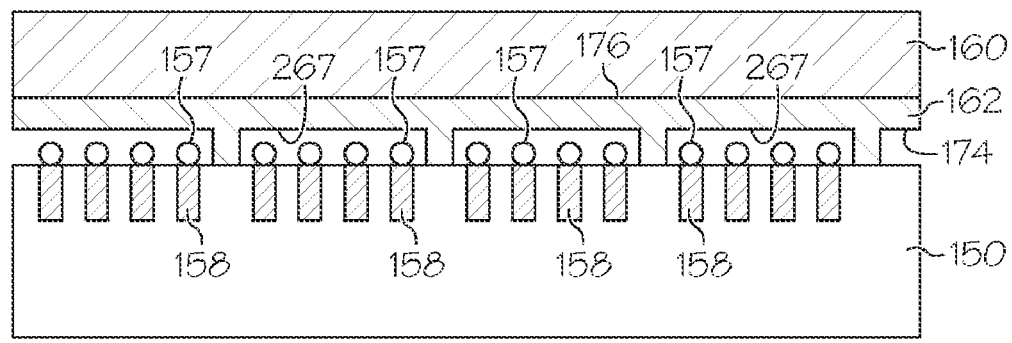

The patterned layer of adhesive 162 is used to bond the front surface of semiconductor substrate 150 to carrier wafer 160 as illustrated in FIG. 11. Patterned surface 174 of the layer of adhesive is brought into contact with the front surface of semiconductor substrate 150 and the carrier wafer, adhesive, and semiconductor substrate are subjected to temperature and pressure to cause the secure bonding of the semiconductor substrate to the carrier wafer. The time, temperature, and pressure utilized in the bonding operation depend on the particular material used in the layer of adhesive. As noted above, unpatterned rear surface 176 of the adhesive layer is in contact with carrier wafer 160 to provide maximum adhesion of the adhesive to the carrier wafer. Because of the crenellated pattern imprinted into patterned surface 174, only a portion of the surface of the semiconductor substrate is in intimate contact with the layer of adhesive. The crenellated layer of adhesive on carrier wafer 160 is positioned to locate depressed regions 267 of the adhesive layer over solder bumps 157 so as to minimize the amount of adhesive material in contact with the solder bumps and to minimize damage to the solder bumps during a subsequent de-bonding process.

Figure 12:
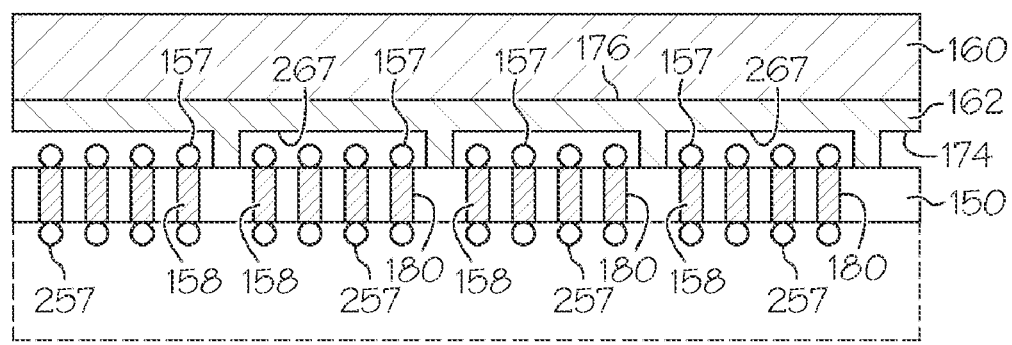

As illustrated in FIG. 12, once semiconductor substrate 150 is securely bonded to carrier wafer 160, the method for fabricating an integrated circuit system can continue, in accordance with one embodiment, by processing the back surface of the semiconductor substrate. For example, the back surface of the semiconductor substrate can be subjected to a thinning operation to thin the substrate sufficiently to expose a portion of conductive material 158. The conductive material now extends through the substrate from front surface to back surface forming through substrate vias (TSVs) 180. The semiconductor substrate can be thinned, for example, by chemical mechanical polishing (CMP). Other process steps can be applied to the now thinned back surface of the semiconductor substrate such as forming a patterned metallized redistribution layer (RDL) in electrical communication with the TSVs and an overlying passivation layer, neither of which is shown in this cross-sectional view. Openings are etched through the passivation layer and solder bumps 257 are attached to the RDL as it is exposed through the openings in the passivation layer. Solder bumps 257 are thus coupled to the TSV and to the integrated circuits formed in and on the front surface of semiconductor substrate 150.

Figure 13:
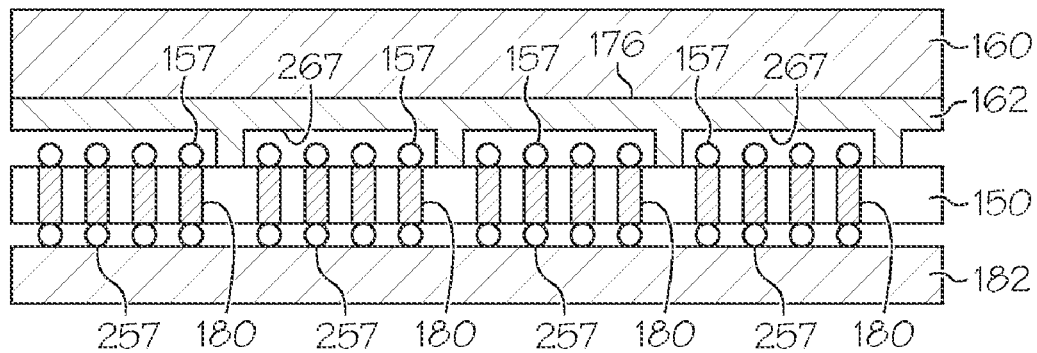

Following the thinning and processing of the back surface of semiconductor substrate 150, the back surface is attached to a substrate 182 as illustrated in FIG. 13. Substrate 182 and the attachment of semiconductor substrate 150 to substrate 182 can be similar to substrate 82 and the attachment of semiconductor substrate 50 to substrate 82 as described above. If substrate 182 is an interposer layer, a printed circuit board, or another IC, semiconductor substrate 150 is bonded to substrate 182 and contact is made between solder bumps 257 on the patterned RDL layer and electrical contacts of a patterned metallization layer on substrate 182. The contacts allow electrical signals to be conveyed between the substrate and the ICs formed in and on semiconductor substrate 150. Again, the patterned RDL layer and the patterned metallization layer on substrate 182 are not shown in this cross-sectional view.

Figure 14:
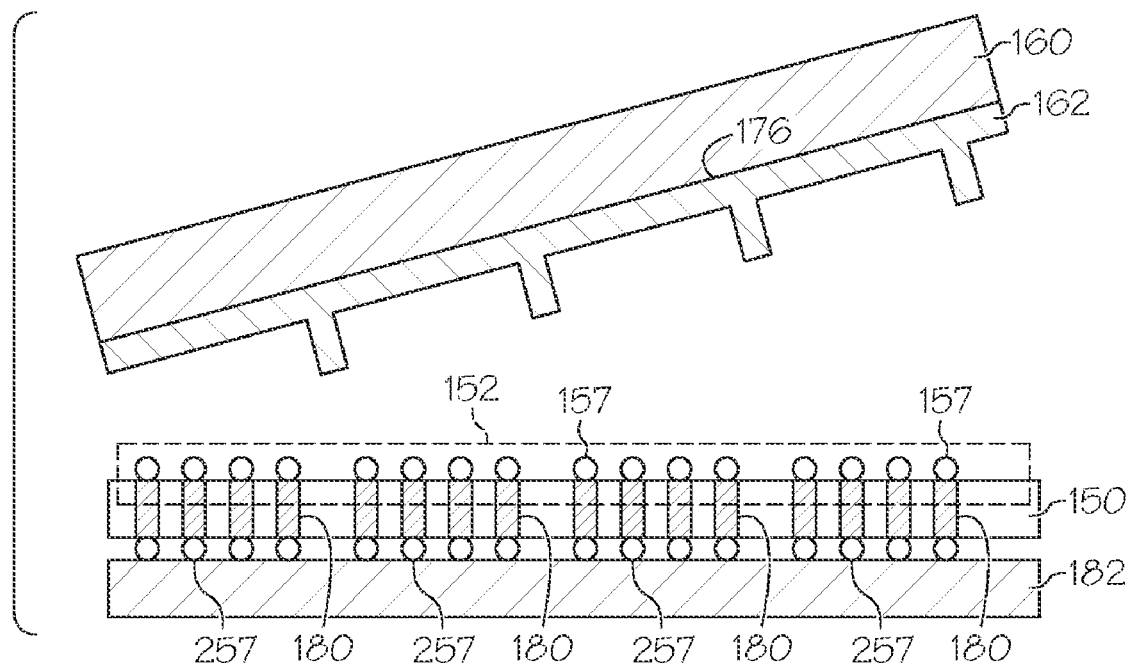

As illustrated in FIG. 14, once semiconductor substrate 150 is attached to substrate 182 and the thinned semiconductor substrate is supported by substrate 182, carrier wafer 160 and patterned adhesive layer 162 can be de-bonded from the semiconductor substrate. The de-bonding process can include the same techniques as described above with respect to the discussion of FIG. 7. Because of the imprinted pattern stamped into the surface of the layer of adhesive, reduced amounts of the adhesive are in contact with the front surface of semiconductor substrate 150 and especially solder bumps 157 in contrast to the complete coverage of the carrier wafer by the adhesive. This means that the adhesive is strongly bonded to the carrier wafer and less strongly bonded to the semiconductor substrate and the solder bumps. The reduced amount of adhesive in contact with the front surface of the semiconductor substrate causes most of the adhesive to remain attached to carrier wafer 160 and only a lesser amount to remain attached to the front surface of the semiconductor substrate and solder bumps during de-bonding. The reduced amount of adhesive in contact with the front surface of semiconductor substrate 150 reduces the possibility of damaging solder bumps 157 and any other features on the surface of the ICs as the carrier wafer and the semiconductor substrate are separated. Because a lesser amount of adhesive remains attached to the front surface of semiconductor substrate 150, there also is less adhesive to remove in subsequent surface cleaning operations and thus, again, less chance to damage the solder bumps or other features on the surface of the IC.

In the above-described embodiments a castellated pattern was imprinted into the surface of the adhesive layer by a stamping process using a patterned stamping form. Other methods are available for imprinted a desired pattern into the surface of the adhesive layer. For example, although not illustrated in the FIGURES, a castellated pattern can also be imprinted into the surface of the adhesive layer by a photolithography and etch process. In accordance with one embodiment a layer of photoresist can be applied over the layer of adhesive and selectively exposed with a castellation pattern. After developing the layer of selectively exposed photoresist the photoresist layer can be used as an etch mask and the castellation pattern can be transferred to the layer of adhesive by etching through a portion of the thickness of the adhesive layer. In accordance with a further embodiment a photosensitive polymer material can be chosen as the adhesive material and that material can be directly and selectively illuminated with exposing radiation through a patterned photolithographic mask. The selectively illuminated polymer material can then be developed to achieve the desired imprinted pattern.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit system comprising:
    forming integrated circuits in and on a semiconductor substrate;
    etching via holes into a front surface of the semiconductor substrate;
    filling the via holes with a conductive material;
    providing a carrier wafer having a layer of adhesive thereon;
    forming an imprinted pattern in the layer of adhesive;
    bonding the front surface of the semiconductor substrate to the carrier wafer with the patterned layer of adhesive;
    removing a portion of a back surface of the semiconductor substrate to expose a portion of the conductive material;
    attaching the back surface to a second substrate; and de-bonding the semiconductor substrate from the carrier wafer.

2. The method of claim 1 wherein forming an imprinted pattern comprises stamping the pattern into the layer of adhesive.

3. The method of claim 1 wherein forming an imprinted pattern comprises forming a mesh pattern, and wherein the layer of adhesive has a thickness and the mesh pattern extends partially through the thickness.

4. The method of claim 3 wherein forming an imprinted pattern comprises forming a mesh pattern having a density of less than 50%.

5. The method of claim 1 wherein providing a carrier wafer comprises providing a carrier wafer formed of a material selected from the group consisting of glass and silicon and wherein the layer of adhesive is applied to the carrier wafer by a process of spin coating followed by a thermal anneal.

6. The method of claim 1 further comprising forming solder bumps overlying and electrically contacting the conductive material.

7. The method of claim 1 further comprising:
after removing a portion of the back surface:
forming a redistribution layer on the back surface, the redistribution layer contacting the conductive material; and
forming a passivation layer overlying the redistribution layer.

8. The method of claim 1 wherein attaching the back surface to a second substrate comprises attaching the back surface to a substrate selected from the group consisting of integrated circuit substrate, interposer substrate and printed circuit board.

9. The method of claim 1 wherein the second substrate includes patterned metallization on a surface thereof and wherein the semiconductor substrate and the second substrate are positioned to provide electrical contact between the conductive material and the patterned metallization.

10. A method for fabricating an integrated circuit system comprising:
forming integrated circuits in and on a semiconductor substrate;
etching via holes into a front surface of the semiconductor substrate;
filling the via holes with a conductive material;
forming a plurality of solder bumps each having substantially the same height overlying the front surface and contacting the conductive material, the plurality of solder bumps arranged in a bump pattern;
providing a carrier wafer having a layer of adhesive thereon;
forming an imprinted pattern in the layer of adhesive, the imprinted pattern providing upstanding portions and depressed portions of the adhesive, the depressed portions located to substantially correspond to the bump pattern;
bonding the front surface of the semiconductor substrate to the carrier wafer with the patterned layer of adhesive, the depressed portions positioned to substantially avoid contact between the layer of adhesive and the solder bumps;
removing a portion of a back surface of the semiconductor substrate to expose a portion of the conductive material;
attaching the back surface to a second substrate; and
de-bonding the semiconductor substrate from the carrier wafer.

11. The method of claim 10 wherein providing a carrier wafer having a layer of adhesive thereon comprises providing a layer of adhesive having a thickness and wherein the depressed portions are depressed less than the thickness and wherein the upstanding portions have a height at least equal to the height of the solder bumps.

12. The method of claim 10 further comprising forming a plurality of second solder bumps on the back surface of the semiconductor substrate in electrical contact with the conductive material.

13. The method of claim 12 wherein attaching the back surface comprises attaching the back surface to a second integrated circuit semiconductor substrate having electrical contact thereon and wherein the second solder bumps are electrically coupled to the electrical contacts.

14. The method of claim 10 wherein providing a carrier wafer having a layer of adhesive thereon comprises:
providing a carrier wafer having a layer of thermoplastic adhesive coated thereon; and
stamping an imprinted pattern in the layer of adhesive.

15. The method of claim 14 wherein stamping comprises stamping a mesh pattern in the layer of adhesive.

16. A method for fabricating an integrated circuit system comprising:
forming integrated circuits in and on a front surface of a semiconductor substrate;
providing a carrier wafer having a patterned layer of adhesive thereon;
bonding the front surface of the semiconductor substrate to the carrier with the patterned layer of adhesive;
polishing a back surface of the semiconductor substrate to thin the semiconductor substrate;
forming a back surface metallization pattern on the thinned semiconductor substrate;
adhering the back surface to a second substrate; and
de-bonding the semiconductor substrate from the carrier wafer.

17. The method of claim 16 wherein providing a carrier wafer comprises:
providing a carrier wafer formed of a material selected from the group consisting of glass and silicon;
depositing a layer of adhesive on a surface of the carrier wafer;
physically stamping a pattern in the layer of adhesive.

18. The method of claim 17 wherein forming integrated circuits comprises forming solder bumps electrically coupled to the integrated circuits and wherein the pattern in the layer of adhesive is positioned to minimize contact between the solder bumps and the patterned adhesive.

19. The method of claim 17 wherein providing a carrier wafer comprises:
providing a carrier wafer having an adhesive layer thereon, the adhesive layer having a thickness;
stamping the adhesive layer to form a mesh pattern, the mesh pattern having raised portions and depressed portions, each of the raised portions and depressed portions less that the thickness.

20. The method of claim 16 wherein adhering the back surface to a second substrate comprises adhering the back surface to a substrate selected from the group consisting of integrated circuit substrate, interposer layer, and printed circuit board.

\* \* \* \* \*